(12) United States Patent
Kim et al.

(10) Patent No.: US 8,072,027 B2
(45) Date of Patent: Dec. 6, 2011

(54) 3D CHANNEL ARCHITECTURE FOR SEMICONDUCTOR DEVICES

(75) Inventors: Suku Kim, Singapore (SG); Dan Calafut, San Jose, CA (US); Ihsiu Ho, Salt Lake City, UT (US); Dan Kinzer, El Segundo, UT (US); Steven Sapp, Felton, CA (US); Ashok Challa, Sandy, ID (US); Seokjin Jo, South Jordan, UT (US); Mark Larsen, Sandy, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 234 days.

(21) Appl. No.: 12/480,065

(22) Filed: Jun. 8, 2009

(65) Prior Publication Data

US 2010/0308402 A1    Dec. 9, 2010

(51) Int. Cl.
    *H01L 29/78*    (2006.01)
(52) U.S. Cl. ............... 257/332; 257/341; 257/E29.257; 257/E29.26
(58) Field of Classification Search ............... 257/331, 257/E29.257, E29.26, 332
See application file for complete search history.

(56) References Cited

U.S. PATENT DOCUMENTS

| | | | |
|---|---|---|---|
| 4,379,305 A | 4/1983 | Mitchell | |
| 4,673,962 A | 6/1987 | Chatterjee | |
| 5,072,266 A | 12/1991 | Bulucea | |
| 5,326,711 A * | 7/1994 | Malhi | 438/138 |
| 5,567,635 A | 10/1996 | Acovic et al. | |
| 5,670,803 A | 9/1997 | Beilstein, Jr. et al. | |
| 6,037,202 A | 3/2000 | Witek | |
| 6,066,878 A | 5/2000 | Neilson | |
| 6,207,994 B1 | 3/2001 | Rumennik | |
| 6,271,562 B1 | 8/2001 | Deboy et al. | |
| 6,281,547 B1 | 8/2001 | So et al. | |
| 6,384,456 B1 | 5/2002 | Tihanyi | |
| 6,710,403 B2 | 3/2004 | Sapp | |
| 2001/0050394 A1 | 12/2001 | Onishi et al. | |
| 2005/0017293 A1 | 1/2005 | Zundel et al. | |
| 2007/0158701 A1 | 7/2007 | Chang | |
| 2007/0173021 A1* | 7/2007 | Kocon et al. | 438/270 |
| 2008/0090339 A1 | 4/2008 | Herrick | |
| 2008/0258213 A1 | 10/2008 | Yilmaz | |
| 2008/0258237 A1 | 10/2008 | Kim | |

FOREIGN PATENT DOCUMENTS

WO PCT/US2010/037656    6/2010

* cited by examiner

*Primary Examiner* — Jerome Jackson, Jr.
*Assistant Examiner* — Paul Budd
(74) *Attorney, Agent, or Firm* — Kirton & McConkie; Kenneth E. Horton

(57) ABSTRACT

Semiconductor devices and methods for making such devices that contain a 3D channel architecture are described. The 3D channel architecture is formed using a dual trench structure containing with a plurality of lower trenches extending in an x and y directional channels and separated by a mesa and an upper trench extending in a y direction and located in an upper portion of the substrate proximate a source region. Thus, smaller pillar trenches are formed within the main line-shaped trench. Such an architecture generates additional channel regions which are aligned substantially perpendicular to the conventional line-shaped channels. The channel regions, both conventional and perpendicular, are electrically connected by their corner and top regions to produce higher current flow in all three dimensions. With such a configuration, higher channel density, a stronger inversion layer, and a more uniform threshold distribution can be obtained for the semiconductor device. Other embodiments are described.

24 Claims, 7 Drawing Sheets

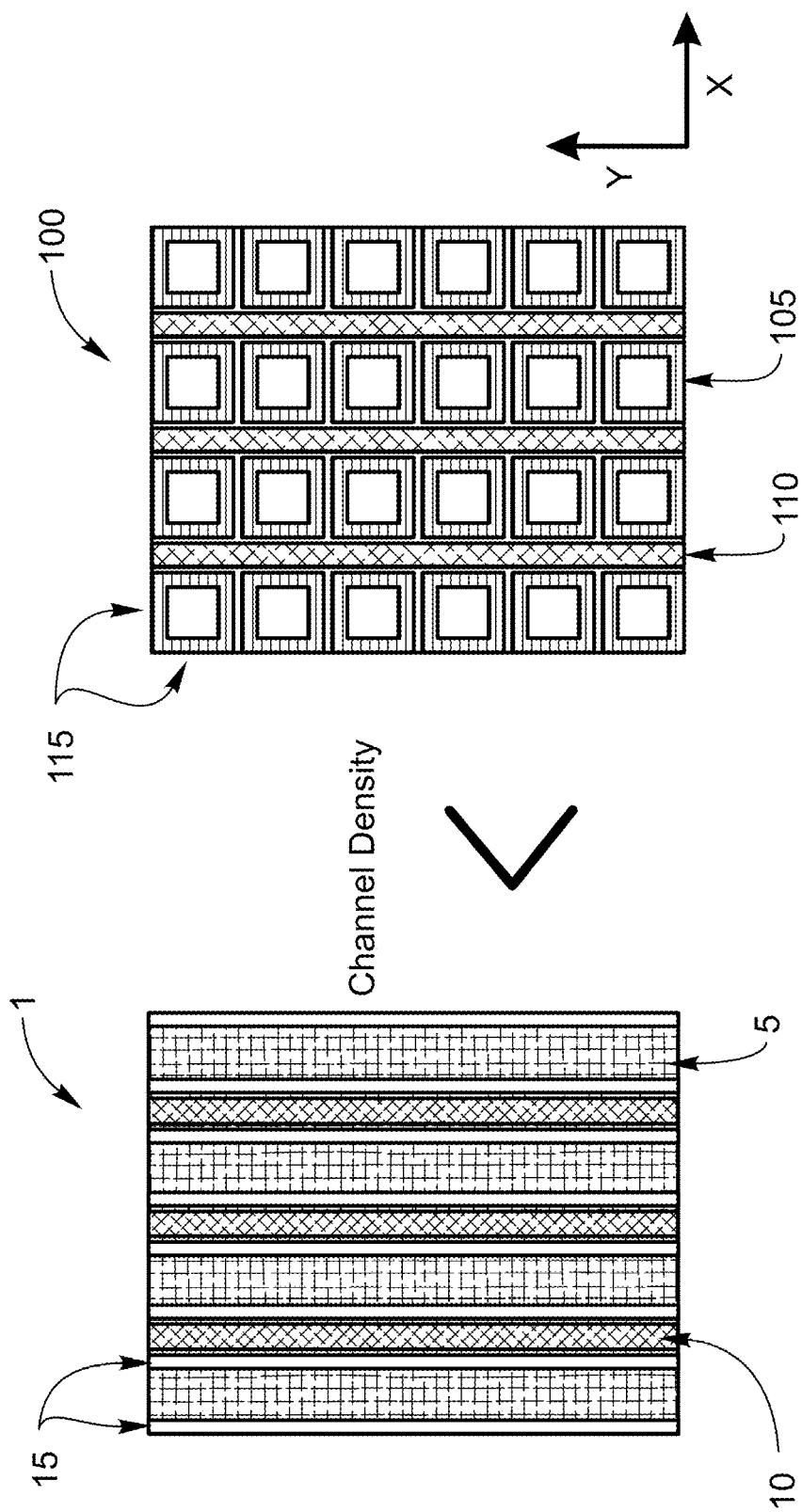

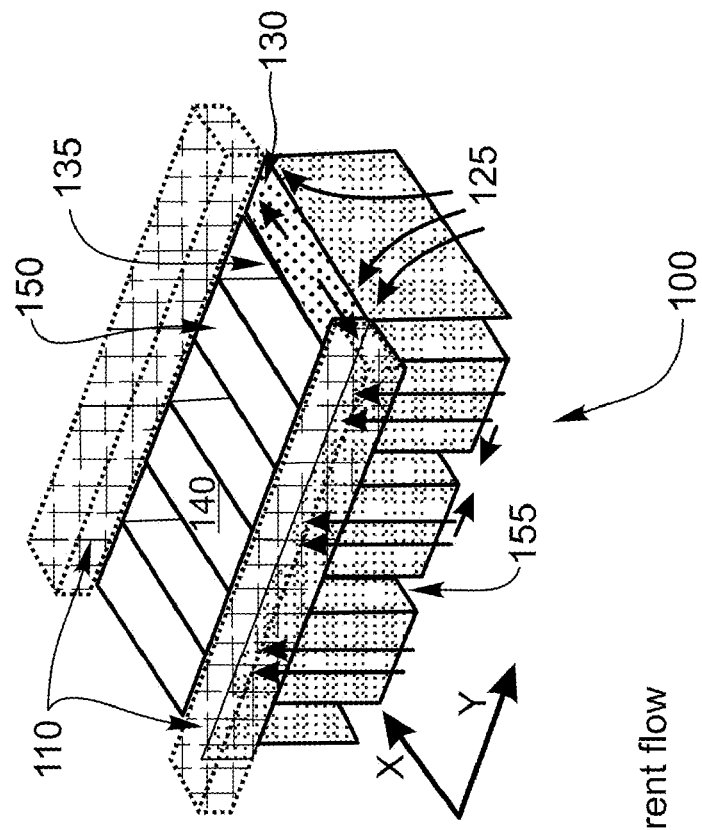
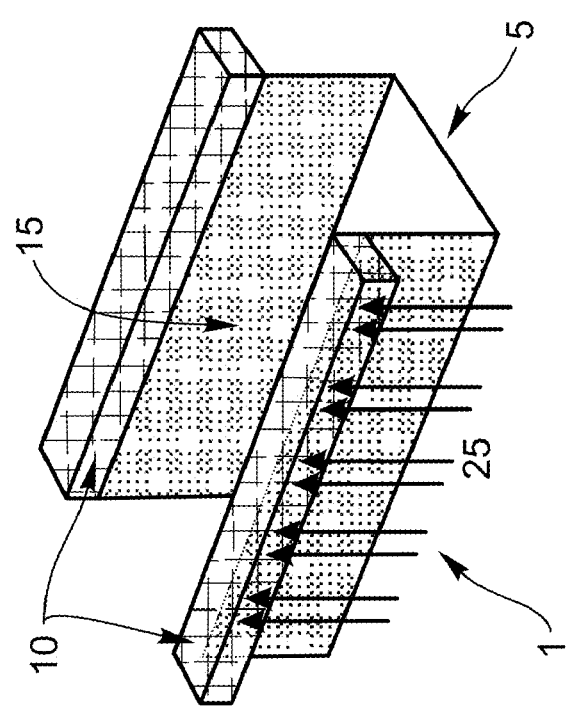
FIG. 3B
FIG. 3A (Prior Art)

3D CHANNEL ARCHITECTURE FOR SEMICONDUCTOR DEVICES

FIELD

This application relates generally to semiconductor devices and methods for making such devices. More specifically, this application describes semiconductor devices and methods for making such devices that contain a three-dimensional (3D) channel architecture.

BACKGROUND

In integrated circuit (IC) fabrication, semiconductor devices such as transistors may be formed on a semiconductor wafer or substrate, which is typically made of silicon. One type of device, a metal oxide silicon field effect transistor (MOSFET) device, can be widely used in numerous applications, including automotive electronics, disk drives and power supplies. Generally, these devices function as switches, and they are used to connect a power supply to a load. The resistance of the MOSFET device should be as low as possible when the switch is closed. Otherwise, power is wasted and excessive heat may be generated.

One type of MOSFET, a trench MOSFET, is illustrated in FIG. 8. Gates 102 and 104 are formed in trenches and surrounded by gate oxide layers 106 and 108, respectively. The MOSFET device 100 can be formed in an N-epitaxial layer 110. A N+ source region 112 is formed at the surface of epitaxial layer 110. A P+ contact region 114 is also formed at the surface of epitaxial layer 110. A P-body region 116 is located below N+ source region 112 and P+ contact region 114. A metal source contact 118 contacts the source region 112 and shorts the source region 112 to the P+ contact region 114 and P body region 116.

The N-epitaxial layer 110 is formed on a substrate 120, and a drain contact 151 is located at the bottom of the substrate 120. The contact for the gates 102 and 104 is likewise not shown, but it is generally made by extending the conductive gate material outside of the trench and forming a metal contact at a location remote from the individual cells. The gate is typically made of phosphorus or boron doped polysilicon.

A region 111 of N-epitaxial layer 110 between the substrate 120 and the P body 116 is generally more lightly doped with N-type impurities than substrate 120. This increases the ability of MOSFET 100 to withstand high voltages. Region 111 is sometimes referred to as a "lightly doped" or "drift" region ("drift" referring to the movement of carriers in an electric field). Drift region 111 and substrate 120 constitute the drain of MOSFET 100.

One feature making the trench configuration attractive is that the current flows vertically through the channel of the MOSFET. This permits a higher cell density than other MOSFETs where the current flows horizontally through the channel and then vertically through the drain. Greater cell density generally means more MOSFETs can be manufactured per unit area of the substrate, thereby increasing the yield of the semiconductor device contains the trench MOSFET.

SUMMARY

This application relates to semiconductor devices and methods for making such devices that contain a 3D channel architecture. The 3D channel architecture is formed using a dual trench structure containing with a plurality of lower trenches extending in an x and y directional channels and separated by a mesa and an upper trench extending in a y direction and located in an upper portion of the substrate proximate a source region. Thus, smaller pillar trenches are formed within the main line-shaped trench. Such an architecture generates additional channel regions which are aligned substantially perpendicular to the conventional line-shaped channels. The channel regions, both conventional and perpendicular, are electrically connected by their corner and top regions to produce higher current flow in all three dimensions. With such a configuration, higher channel density, a stronger inversion layer, and a more uniform threshold distribution can be obtained for the semiconductor device.

BRIEF DESCRIPTION OF THE DRAWINGS

The following description can be better understood in light of the Figures, in which:

FIGS. 1A and B shows some embodiments of channel regions formed in the trenches of a prior art device and a semiconductor devices as described herein;

FIGS. 3A and B shows yet other embodiments of channel regions formed in the trenches of a prior art device and semiconductor devices as described herein;

Figure 2B:
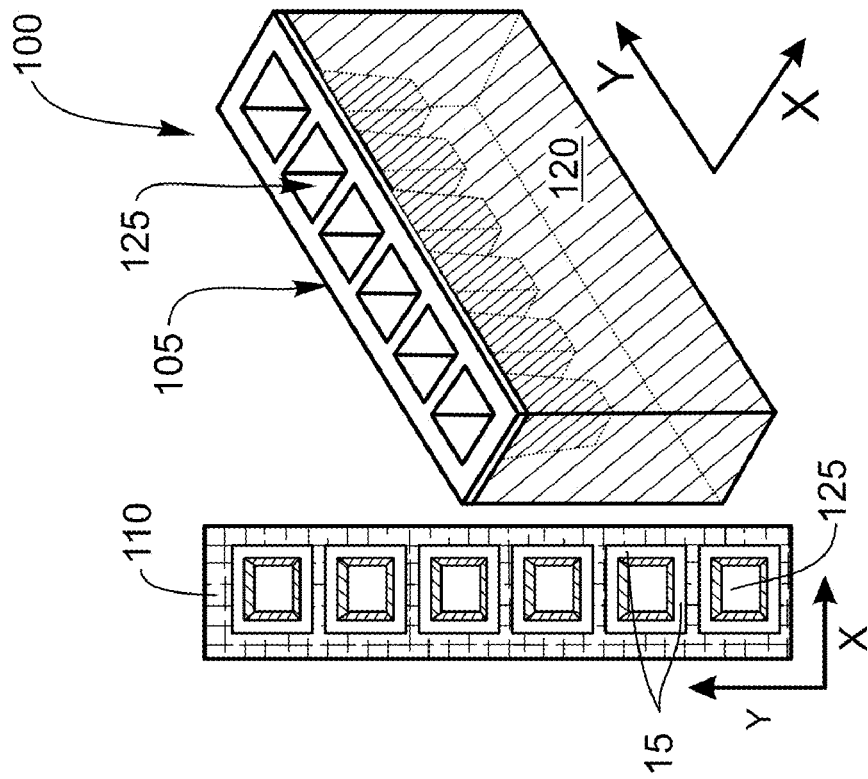
FIGS. 2A and B depicts other embodiments of channel regions formed in the trenches of a prior art device and a semiconductor devices as described herein.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while the invention is described with reference to trench MOSFET devices, it could be modified for other devices formed in trenches which need to be isolated, such as bipolar devices, BDCMOS devices, or other types of transistor structures. As well, although the devices of the invention are described with reference to a particular type of conductivity (P or N), the devices can be configured with the opposite type of conductivity (N or P, respectively) by appropriate modifications.

Some embodiments of the semiconductor devices and methods for making such device are shown in FIGS. 1-7. In FIG. 1, a comparison is shown between the channel architecture of a conventional device 1 on the left against the semiconductor device 100 containing a 3D channel architecture that can be formed in some embodiments described herein. In this Figure, the semiconductor devices contain a trench region or structure (trench 5 and 105) that has been formed. The trench contains a conductive material (such as polysilicon) therein that forms the gate of the semiconductor device. The semiconductor devices also contain a source well region (source 10 and 110) that is located between each trench.

Both semiconductor devices depicted in FIGS. 1A and B also contain channel regions (or channels) for current flow in the semiconductor devices. In the conventional architecture shown in FIG. 1A, the channels 15 extend in a line (in the Y direction) abutting each side of the trench 5. In the semiconductor devices 100 shown in FIG. 1B, the channel architecture contains channels 115 that are formed in both the X direction and in the Y direction. Since the channels 115 also extend in the Z direction, the semiconductor devices 100 contain a 3D channel architecture and contain an increased channel density relative to the conventional devices 1.

In the embodiments depicted FIG. 1B, the 3D configuration contains 24 channels 115 whereas the conventional configuration shown in FIG. 1A only contains only 8 channels 15, an increase of about 300%. In other embodiments, the 3D configuration can increase the channel density anywhere from more than 100% to about 300%. In yet other embodiments, the 3D configuration can increase the channel density anywhere from 100% to about 110%.

Figure 2A:
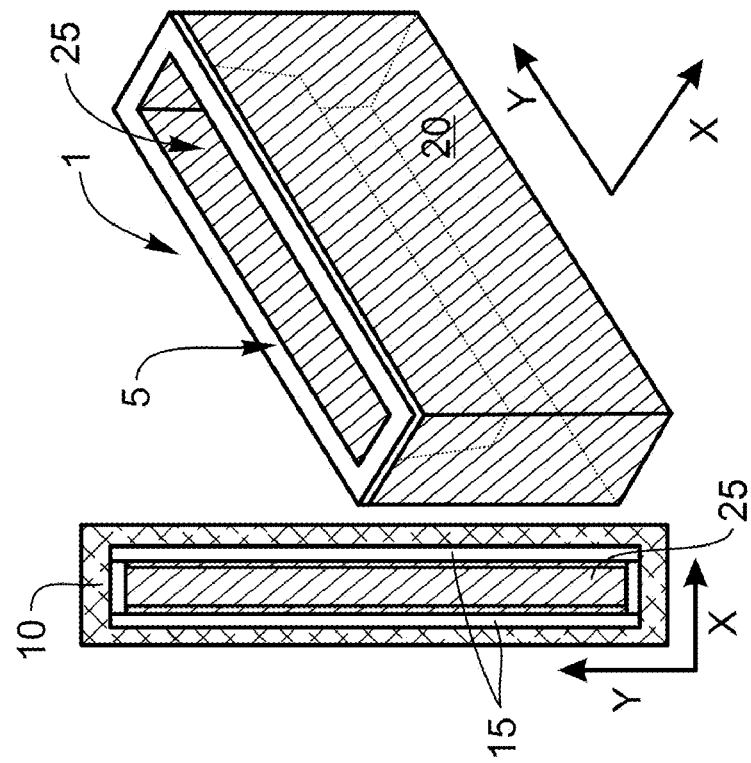
Figure 4:
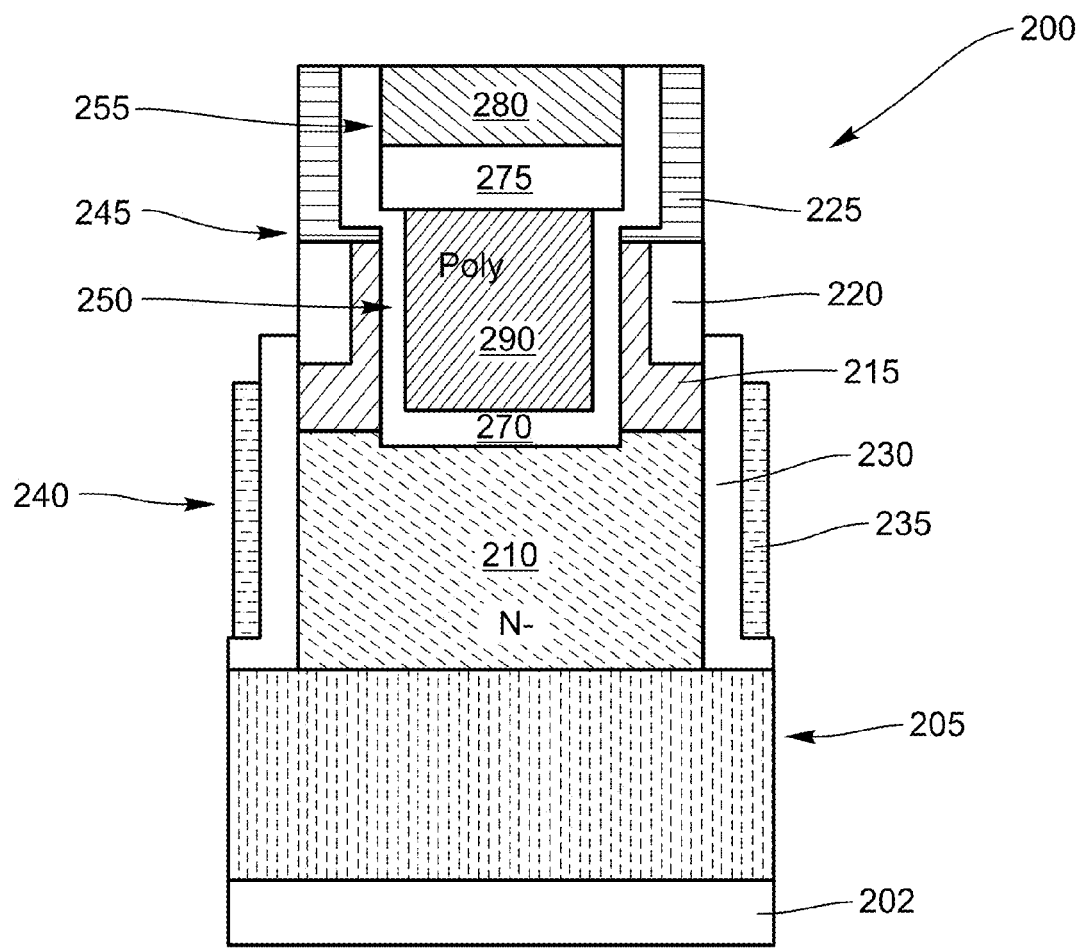
FIG. 4 depicts some embodiments of a semiconductor device containing a 3D channel architecture in a trench.
Figure 5:
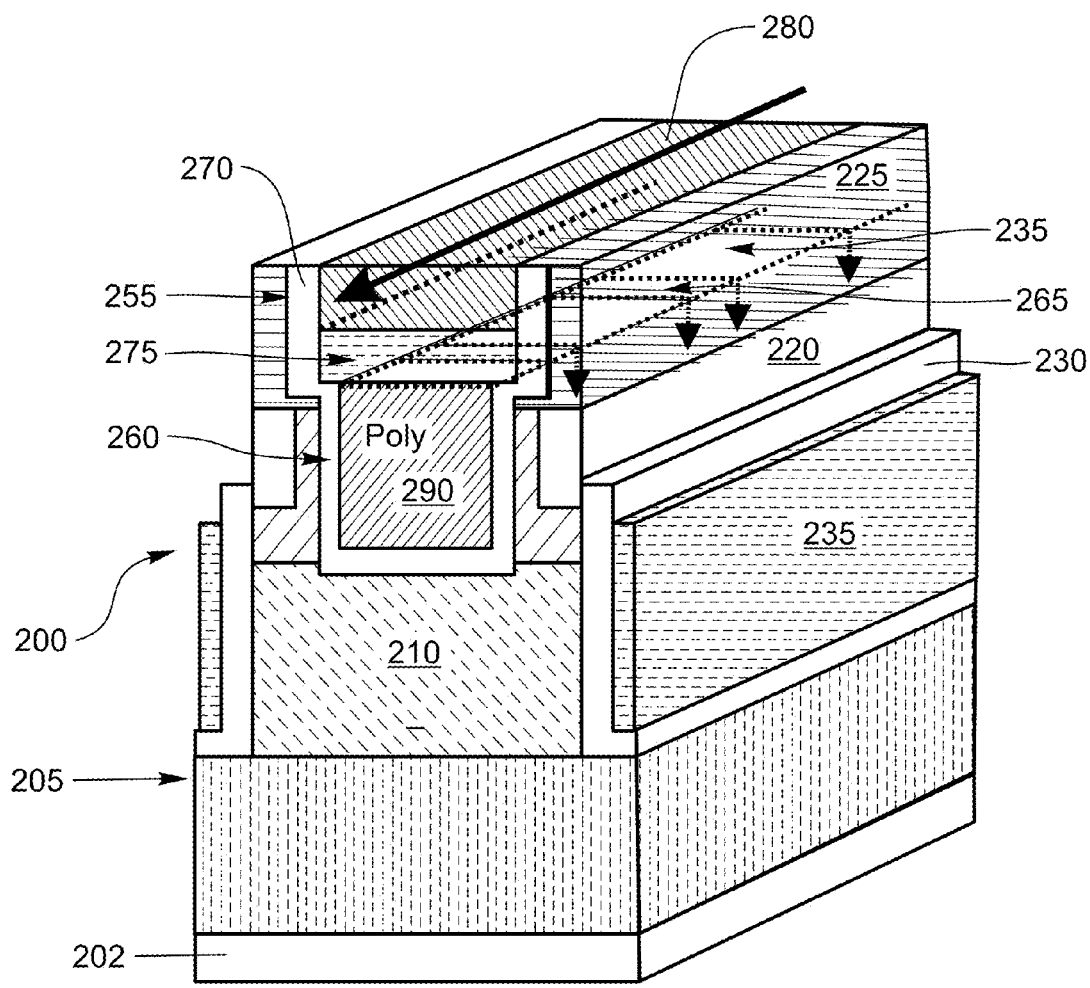
FIG. 5 shows other embodiments of a semiconductor device containing a 3D channel architecture.

FIGS. 2A and B illustrates other embodiments of the conventional semiconductor devices 1 and those semiconductor devices 100 containing a 3D channel architecture. In both devices, the channels containing a conductive material (25 and 125) have been formed in the trench. The channels are still bordered by the source region. The trench has been formed in a substrate (20 and 120) which is shown in shadow so that the shape of the trench can be seen. In these embodiments, the substrate comprises a semiconductor material, such as silicon. The substrate can optionally contain a silicon epitaxial layer that has been formed on an upper surface thereof. The substrate can optionally contain a dopant (whether p-type or n-type) or plurality of dopants at any concentration known in the art.

As shown in FIG. 2A, the channels 15 in the conventional devices 1 extend only in the Y and the Z directions. However, the channels 115 in the device 100 extend in the X, Y and Z directions to form the 3D configuration, as shown in FIG. 2B. In the embodiments depicted FIG. 2B, the 3D configuration contains 6 channels 115 whereas the conventional configuration only contains only 2 channels 15, an increase of about 300%.

In FIGS. 1A and B and 2A and 2B, the channels 115 are depicted as being substantially squares in shape when viewed from the top. In other embodiments, such as those shown below in FIGS. 3A and B, the channels 115 can be substantially rectangular in shape. In yet other embodiments, any shape can be used, including corner-rounded rectangles and squares, circle, or oval shapes. In FIG. 3A, the conventional semiconductor devices 1 contain the trench 5 that has been formed within the substrate (not shown). The source regions 10 have been formed in the upper regions of the substrate by doping with an n+ type dopant. Polysilicon has been deposited in the trench 5 to form the channels 15 extending in the Y and Z directions. With such a configuration, the current 25 in the semiconductor device 1 flows in a single direction (shown by arrows) through the channels 15.

The semiconductor devices 100 shown in FIG. 3B contain a trench 105 that has been formed within the substrate (again, not shown). The source regions 110 have been formed in the upper regions of the substrate by doping with an n+ type dopant. These semiconductor devices 100, however, contain channels 115 that extend in the X, Y, and Z directions. The channels 115 have been formed by using a two level trench structure that contains lower trenches and an upper trench. The upper trench 130 can be used to contain the conductive layer that connects all of the gate conductive materials. The lower trenches can be used to form pillar-type trenches 135 where x- and y-channels are formed. Each of the pillar trenches 135 can be separated by an insulating layer 14 (such as an oxide layer) that has been formed so that it is present between one channel 115 and the next. With such a configuration, the current flow can extend in the X, Y, and Z directions as shown in FIG. 3.

In some embodiments, the source region 110 can be made either at both sides next to the trench area as shown in FIG. 3B. In other embodiments, the source region 5 can be made around the entire perimeter of each pillar trench 135. The configuration of these latter embodiments allows the device to have less current crowding around its contact and/or source areas.

The channels 115 in the 3D configuration can be electrically connected to each other. In the embodiments shown in FIG. 3B, the channel regions are electrically connected by the corner and top channels, thereby producing a higher current flow 125 since the current flows in three directions (X, Y, and Z directions).

The depth of the channels 115 can be substantially similar to any known depth of the conventional channels and, therefore, substantially similar to the depth of the trench 105. The pitch of the channels in the y direction (the y-pitch) can range from about 0.1 µm to about 10 µm. The pitch of the channels in the x direction (the x-pitch) can range from about 0.1 to about 10 µm. Given these dimensions, the total area of the channels 115 can be increased by about 10 to about 300% over the channels 15 given the same space in which they are respectively formed.

In some embodiments, the x-pitch can be wider than the thickness of the mesa 150 that separates adjacent pillar trenches 135 because newly generated channel area can be larger than the channel area lost by such structure. In other embodiments, the x-pitch can be smaller than the thickness of the mesa.

Figure 7:
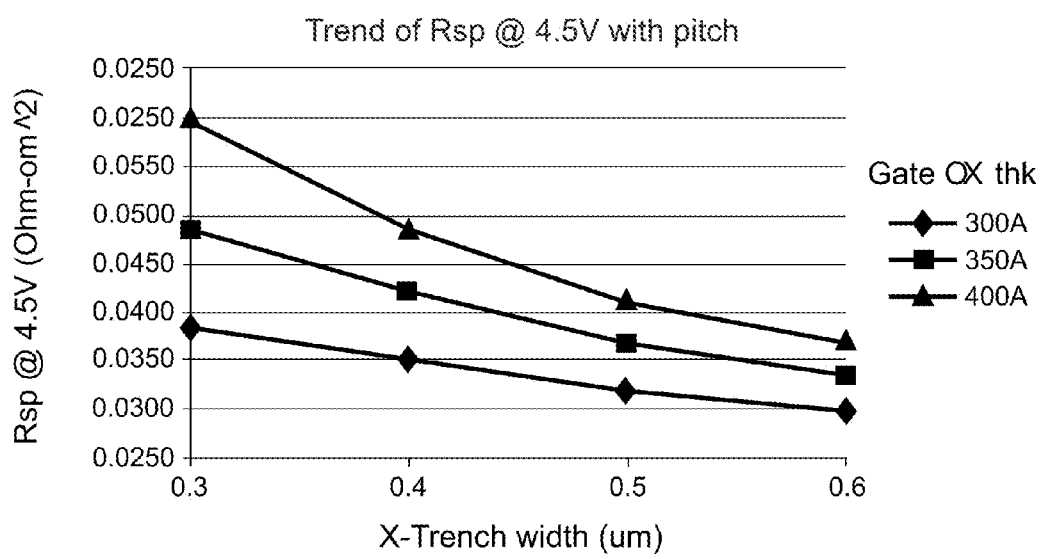
FIG. 7 depicts the specific on-resistance trend as a function of the trench width in some embodiments of semiconductor devices containing a trench 3D channel architecture.
Figure 8:
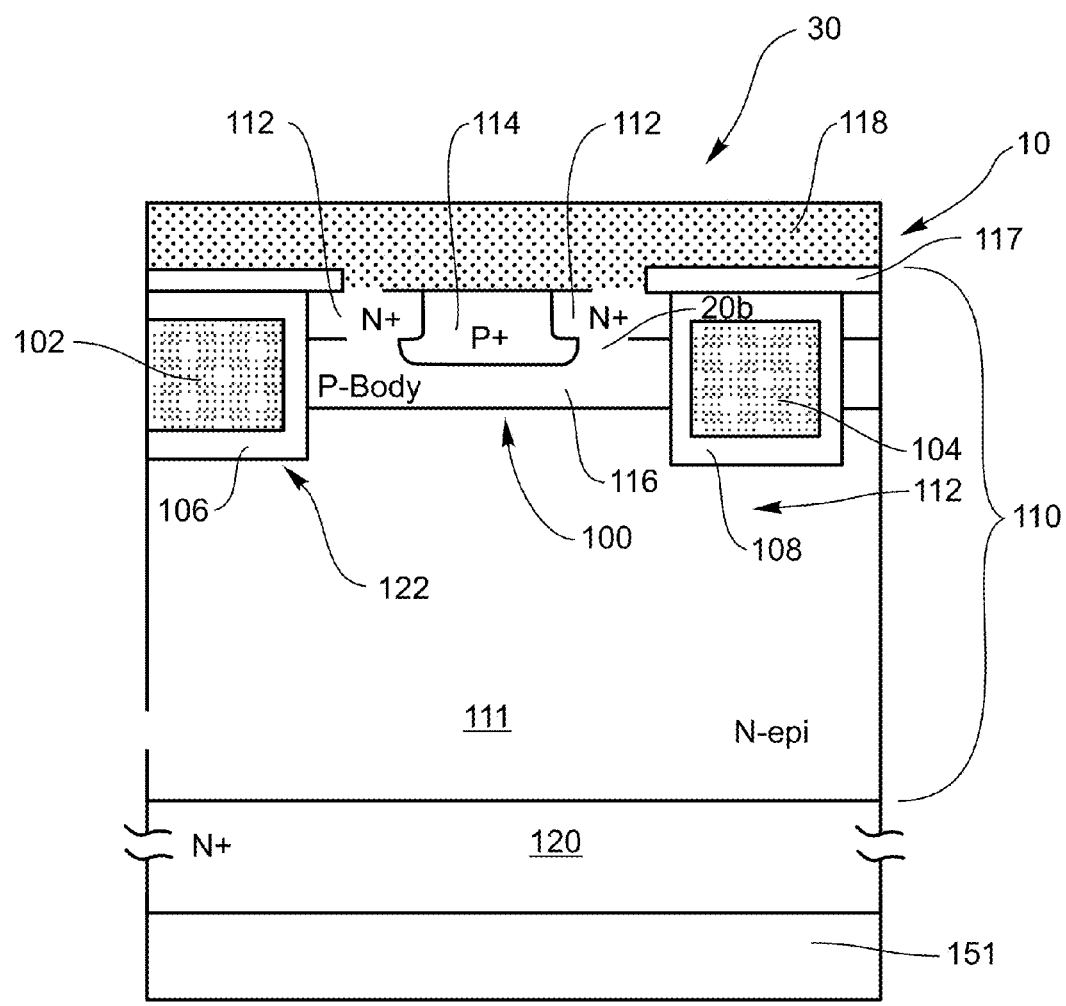
FIG. 8 shows a conventional trench MOSFET device.

The x-pitch can be increased without increasing the on-resistance of the semiconductor device 100 containing the 3D channel architecture. In conventional channels, increasing the pitch in the x-direction would increase the on-resistance because of the increased width of the channel. With the 3D architecture, though, increasing the x-pitch does not increase the on-resistance because of the gap 155 remaining between adjacent pillar trenches. This feature of the 3D channel architecture is illustrated by FIG. 7 in which the specific on-resistance ($R_{sp}$) actually decreased as the x-pitch was increased.

The 3D channel architecture can be manufacture by any method that provides any of the structures described above. In some embodiments, a semiconductor substrate is first provided. Any substrate known in the art can be used in the invention. Suitable substrates include silicon wafers, epitaxial Si layers, bonded wafers such as used in silicon-on-insulator (SOI) technologies, and/or amorphous silicon layers, all of which may be doped or undoped. In some instances, the substrate contains a single crystal silicon wafer having one or more epitaxial ("epi") Si layer located in an upper region thereof. The epitaxial layer(s) can be provided using any known process in the art, including any known epitaxial deposition process. The epitaxial layer can be doped with an n-type dopant to the desired concentration. Next, dopants of an n-type conductivity are implanted to form the source region 110 in an upper portion of the epitaxial layer (or the substrate) until the desired concentration and depth of the source region is formed.

Next, the dual trench structure is formed. In some instances, the dual trench structure is formed by any known process. In other embodiments, a first mask is deposited and then used to etch the trench region to a first depth which is substantially similar to the upper surface of the mesas 150 between the pillar trenches. Then, a second mask is deposited to cover the areas where the mesas will be formed. A second etch is then performed to etch the pillar trenches 135 to a second depth which is the bottom of the dual trench structure. In other embodiments, the dual trench structure can be formed by a resist etch trimming process.

Next, an oxide layer 140 is formed on the resulting structure in the pillar trenches 135 and on the upper surface of the mesas 150. This oxidation process can be performed by any oxide deposition or oxidation process known in the art. In some embodiments, the oxide layer 140 is formed by chemical vapor deposition. The thickness of the oxide layer 140 can be adjusted to any thickness needed for the semiconductor device that will be formed.

The process continues when a layer of polysilicon (or other conductive material) is deposited in the dual trench structure. The polysilicon is deposited until the pillar trenches 135 are substantially filled or overfilled and cover the mesa (between the pillars). The polysilicon can be deposited using any process known in the art, including Chemical Vapor Deposition (CVD), PECVD, LPCVD, etc. In some embodiments, the polysilicon layer also fills in the upper trench and serves as the conductive layer connecting the polysilicon in the pillar trenches. In other embodiments, the polysilicon layer can be etched back to remove any excess material above the mesas using any process known in the art. Then, a separate conductive layer may be deposited on the top of the pillar trenches and mesas to connect the polysilicon in the pillar trenches.

The 3D channel architecture can be used in any number of semiconductor devices. In some configurations, the 3D channel architecture can be used in the semiconductor devices 200 depicted in FIGS. 4 and 5. These devices 200 contain a drain 202 on the bottom of an n+ Si substrate 205 with an epitaxial layer 240 with a lower portion that has been doped with a n-type dopant to form a N– body region 210. The middle portion of the epitaxial layer has been doped with a p-type dopant to form p-well 215. The upper portion of the epitaxial layer has been doped with an n-type dopant to form heavy body region 220 and N– source region 225. A shield oxide layer 230 and a shield 235 (formed of polysilicon or a metal) has been formed around the epitaxial layer 240.

The devices 200 also have a dual trench structure 245 formed in an upper surface of the substrate containing the epitaxial layer 240. The dual trench structure contains a lower trench 250 and an upper trench 255. The lower trench 250 contains a plurality of pillar trenches 260 that are separated by mesas 265. A silicon oxide layer 270 has been formed in the bottom and sidewalls of the lower trench 250, on the upper surface of the mesas 265, and on the sidewalls of the upper trench 255. A conductive top layer 275 (such as silicide, polysilicon, metal, or a combination thereof) has been formed on the upper surfaces of the polysilicon layer 290 in each pillar trench and on the upper surface of the mesas. And a doped dielectric layer 280 (i.e., BPSG) is formed over the silicide layer.

With such a structure, MOSFET devices have been formed in the trenches. The oxide layer 270 operates as a gate oxide and the polysilicon layer 290 in the pillar trenches operates as a gate. The gate polysilicon layers are connected through the conductive top layer so that neither a via structure nor a two-level metal layer is needed for the polysilicon gate to be isolated from the source metal. The shield and the shield oxide are formed next to the trenches for a higher breakdown voltage (BV) rating.

Figure 6:
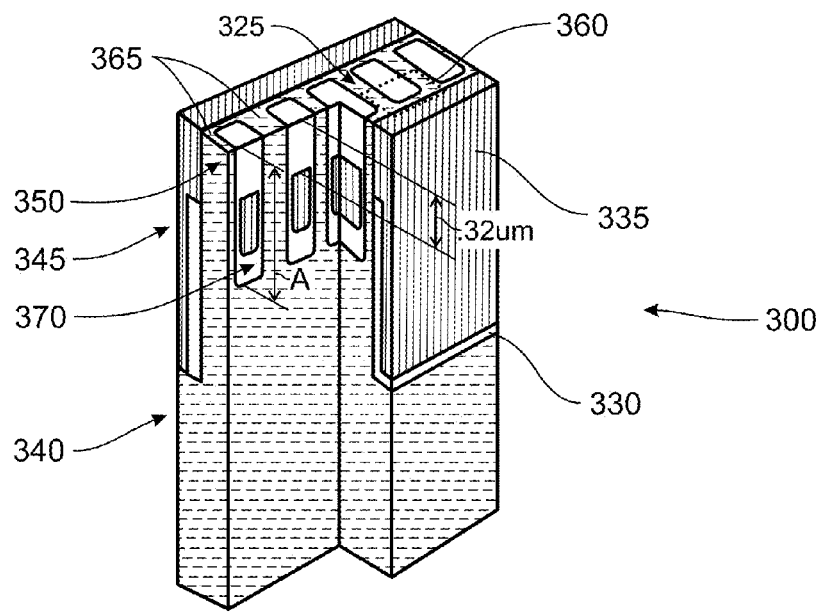
FIG. 6 shows some embodiments of a trench power MOSFET device containing a 3D channel architecture.

Another 3D channel architecture is depicted in the simulated semiconductor devices 300 that are depicted in FIG. 6. In the embodiments shown in FIG. 6, the devices 300 contain an n+ Si substrate with an epitaxial layer 340 that has been doped with an n-type dopant to form N– source region 325. A shield oxide layer 330 and a shield 335 (formed of polysilicon or a metal) has been formed around the epitaxial layer 340. The devices 300 contain a dual trench structure 345 formed in an upper surface of the substrate containing the epitaxial layer 340. The dual trench structure contains a lower trench 350 and an upper trench 355. The lower trench 350 contains a plurality of pillar trenches 360 that are separated by mesas 365. A silicon oxide layer 370 has been formed in the bottom and sidewalls of the lower trench 350, on the sidewalls of the upper trench 355, but not on the top of the mesas. A conductive top layer (such as silicide, polysilicon, metal, or a combination thereof) is not depicted but could be formed on the upper surfaces of the polysilicon layer in each pillar trench and on the upper surface of the mesas.

In the devices described above, the degree of inversion layer formation and threshold voltage can be modified and even controlled by not only the process parameters (implant dose, gate oxide thickness, etc.), but also by the distance between the pillar trenches (or the width of the mesas). As the distance between adjacent channels becomes longer, the threshold voltage in the x direction becomes greater than the threshold voltage in the y direction. As this distance is decreased, the energy levels of the two trenches interfere, and the threshold voltage decreases. Combining these two effects can therefore be used to create a uniform threshold voltage and a stronger inversion layer which, in turn, can be used to reduce $R_{sp}$ even more.

In some embodiments, the mesa width can range from about 0.01 to about 10 μm. In other embodiments, the mesa width can be about 1 μm. The diameter of the pillar trenches and the distance between the pillar trenches (the width of the mesas) can be controlled by the process parameters when they are formed, including the photo mask used in the process, the growth of the oxide layer, and the etching process.

The 3D configuration of the channel architecture provides additional channel regions that are aligned substantially perpendicular to the channels used in conventional channels. This configuration therefore increases the channel density and reduces the $R_{sp}$. The channels in the 3D configuration are connected by the corner and top channel regions to produce a high current flow that is not limited to a single direction as in conventional channels. As well, the 3D architecture can help to avoid the challenges related to pitch reduction, such as device performance degradation (e.g. low UIL capability) or sensitivity to process variation (e.g. heavy body contact formation). And this architecture can be a complementary approach for the conventional pitch reduction to keep lowering $R_{sp}$.

It is understood that all material types provided herein are for illustrative purposes only. Accordingly, one or more of the various dielectric layers in the embodiments described herein may comprise low-k or high-k dielectric materials. For example, the oxide layer formed before the polysilicon deposition in the trench may comprise a high-k dielectric material.

In some embodiments, a method for making a semiconductor device comprises the processes of: providing a semiconductor substrate; doping an upper portion of the substrate to form a source region; masking and etching the substrate to form an upper trench extending in a y direction so that it is proximate the source region; masking and etching the substrate to form a plurality of lower trenches extending in an x- and y-directions and separated by a mesa; forming an oxide layer on the bottom and sidewall of the lower trenches and on the sidewall of the upper trench; depositing a first portion of a conductive or semi-conductive layer on the oxide layer in the lower trenches; and depositing a second portion of conductive or semi-conductive layer on the first conductive or semi-conductive layer and the mesas within the upper trench. In these embodiments, the device can contain channels extending in the x, y, and z directions to form a three dimensional channel structure. The mesa width between the lower trenches can be adjusted to control the threshold voltage and the inversion layer without changing the doping profile. The method can further comprise forming the oxide layer also on an upper portion of the mesa. The method can form the width of the lower trenches in the x direction to be more than the length of the mesa separating adjacent lower trenches. The method can form the width of the lower trenches to range from about 0.01 to about 10 μm and the length to range from about 0.01 to about 10 μm. The method can form the first portion of the conductive or semi-conductive layer as a first layer comprising polysilicon. The method can form the second portion of the conductive or semi-conductive layer as a second layer comprising a silicide.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor device, comprising:
a semiconductor substrate containing a source region in an upper portion of the substrate;
a dual trench structure in an upper portion of the substrate, wherein the dual trench structure contains:
a plurality of discrete lower trenches separated by a mesa between adjacent lower trenches, the lower trenches having sidewalls extending in both an x- and a y-direction; and
an upper trench overlying the lower trenches, the upper trench having sidewalls extending in the y direction that are longer than the sidewalls extending in the x direction;
an oxide layer located on the bottom, sidewall of the lower trenches, and sidewall of the upper trench;
a first conductive or semi-conductive layer located on the oxide layer in the lower trenches; and
a second conductive or semi-conductive layer located on the first conductive or semi-conductive layer and the mesa.

2. The device of claim 1, wherein the device contains channels extending in the x and y directions and in a z directions to form a three dimensional channel structure.

3. The device of claim 1, wherein an upper portion of the lower trenches opens into a lower portion of the upper trench.

4. The device of claim 1, wherein the oxide layer is also located on an upper portion of the mesa.

5. The device of claim 1, wherein the width of the lower trenches in the x direction is more than the length of the mesa separating adjacent lower trenches.

6. The device of claim 1, wherein a width of the lower trenches ranges from about 0.01 to about 10 μm and a length ranges from about 0.01 to about 10 μm.

7. The device of claim 1, wherein the first and second conductive or semi-conductive layers are formed from the same material and form a continuous layer or formed from a different material and form two separate layers.

8. The device of claim 7, wherein the first conductive or semi-conductive layer is deposited to cover the mesa and the second conductive or semi-conductive layer is deposited on that first layer.

9. A trench MOSFET device containing a three dimensional channel architecture, comprising:
a silicon substrate with an epitaxial layer in an upper portion thereof, the epitaxial layer containing a source region in an upper portion thereof;
a dual trench structure in an upper portion of the substrate, wherein the dual trench structure contains:
a plurality of discrete lower trenches separated by a mesa between adjacent lower trenches, the lower trenches having sidewalls extending both in an x- and a y-direction; and
an upper trench overlying the lower trenches, the upper trench having sidewalls extending in the y direction that are longer than the sidewalls extending in the x direction;
a gate oxide layer located on the bottom, sidewall of the lower trenches, and sidewall of the upper trench;
a polysilicon gate located on the gate oxide layer in the lower trenches;
a conductive layer located on the polysilicon gate and the mesa and in the upper trench; and
an insulating layer located on the conductive layer in the upper trench between the source region.

10. The device of claim 9, wherein the device contains channels extending in the x and y directions and in a z directions to form a three dimensional channel structure.

11. The device of claim 10, wherein the current flows through the dual trench structure in three dimensions.

12. The device of claim 9, wherein the oxide layer is also located on an upper portion of the mesa.

13. The device of claim 9, wherein a width of the lower trenches in the x direction is more than a length of the mesa separating adjacent lower trenches.

14. The device of claim 9, wherein a width of the lower trenches ranges from about 0.01 to about 10 μm and a length ranges from about 0.01 to about 10 μm.

15. The device of claim 9, wherein the first and second conductive or semi-conductive layers are formed from the same material and form a continuous layer or are formed from a different material and form two separate layers.

16. The device of claim 9, further comprising a shield oxide layer and a conductive shield around the epitaxial layer.

17. The device of claim 9, wherein the oxide layer is also located on an upper portion of the mesa.

18. The device of claim 9, wherein a width of the lower trenches in the x direction is more than a length of the mesa separating adjacent lower trenches.

19. The device of claim 9, wherein a width of the lower trenches ranges from about 0.01 to about 10 µm and a length ranges from about 0.01 to about 10 µm.

20. The device of claim 9, wherein the first and second conductive or semi-conductive layers are formed from the same material and form a continuous layer or are formed from a different material and form two separate layers.

21. The device of claim 9, further comprising a shield oxide layer and a conductive shield around the epitaxial layer.

22. A trench MOSFET device containing a three dimensional channel architecture, comprising:
- a silicon substrate with an epitaxial layer in an upper portion thereof, the epitaxial region layer containing a source region in an upper portion thereof;
- a dual trench structure in an upper portion of the substrate, wherein the dual trench structure contains:
  - a plurality of discrete lower trenches separated by a mesa between adjacent lower trenches, the lower trenches having sidewalls extending in both an x- and a y-direction; and
  - an upper trench overlying the lower trenches, the upper trench having sidewalls extending in the y direction that are longer than the sidewalls extending in the x direction;
  - thereby forming channels extending in the x and y directions and in a z direction and making a three dimensional channel structure so that current flows through the dual trench structure in three dimensions;
- a gate oxide layer located on the bottom, sidewall of the lower trenches, and sidewall of the upper trench;
- a polysilicon gate located on the gate oxide layer in the lower trenches;
- a conductive layer located on the polysilicon gate and the mesa and in the upper trench; and
- an insulating layer located on the conductive layer in the upper trench between the source region.

23. A semiconductor device, comprising:
- a semiconductor substrate containing a source region in an upper portion of the substrate;
- a dual trench structure in an upper portion of the substrate, wherein the dual trench structure contains with a plurality of lower trenches extending in both x- and y-directional channels and separated by a mesa and an upper trench extending in a y direction and located in an upper portion of the substrate proximate the source region; wherein the width of the lower trenches in the x direction is more than the length of the mesa separating adjacent lower trenches,
- an oxide layer located on the bottom, sidewall of the lower trenches, and sidewall of the upper trench;
- a first portion of a conductive or semi-conductive layer located on the oxide layer in the lower trenches; and
- a second portion of a conductive or semi-conductive layer located on the first conductive layer and the mesa.

24. The device of claim 23, wherein the current flows through the dual trench structure in three dimensions.

* * * * *